United States Patent
Chia et al.

[19]

[11] Patent Number: 6,057,594
[45] Date of Patent: May 2, 2000

[54] HIGH POWER DISSIPATING TAPE BALL GRID ARRAY PACKAGE

[75] Inventors: Chok J. Chia; Qwai H. Low; Maniam Alagaratnam, all of Cupertino, Calif.

[73] Assignee: LSI Logic Corporation, Milpitas, Calif.

[21] Appl. No.: 08/842,379

[22] Filed: Apr. 23, 1997

[51] Int. Cl.[7] .......................... H01L 23/495; H01L 23/34; H01L 23/48
[52] U.S. Cl. ........................... 257/668; 257/780; 257/728
[58] Field of Search ..................................... 257/706, 668, 257/737, 8, 780, 781, 734, 798, 728

[56] References Cited

U.S. PATENT DOCUMENTS

| | | | |
|---|---|---|---|
| 4,965,702 | 10/1990 | Lott et al. | 361/401 |
| 5,311,060 | 5/1994 | Rostoker et al. | 257/796 |
| 5,409,865 | 4/1995 | Karnezos | 437/210 |
| 5,668,405 | 9/1997 | Yamashita . | |
| 5,717,252 | 2/1998 | Nakashima . | |
| 5,729,051 | 3/1998 | Nakamura . | |
| 5,753,969 | 5/1998 | Suzuya et al. | 257/667 |
| 5,869,889 | 2/1999 | Chia et al. | 257/701 |

OTHER PUBLICATIONS

"Multi–Layer Tab Tape Having Distinct Signal, Power and Ground Planes, Semiconductor Device Assembly Employing Same, Apparatus for and Method of Assembling Same," U.S. Patent Application Serial No. 08/625,641 filed Mar. 29, 1996.

*Primary Examiner*—Teresa M. Arroyo

[57] ABSTRACT

A molded tape ball grid array package has a base structure including a heat conductive substrate and flex tape extending from opposing regions on a surface of the substrate with molded plastic material between the flex tape and the substrate. The flex tape has at least one conductive metal lead pattern which can be positioned on a side of the tape facing the substrate with a plurality of apertures exposing the conductive lead pattern from an opposing side of the tape for solder ball bonding. A semiconductor integrated circuit chip is mounted to a central portion of the substrate between the opposing regions of the flex tape with wire bonding interconnecting bond pads on the chip to the metal lead pattern. The chip and wire bonding are then encapsulated on the substrate. The structure is economical and permits high power dissipation from an integrated circuit. The molding process in fabricating the integrated circuit package is economical and readily implemented using injection molding.

15 Claims, 2 Drawing Sheets

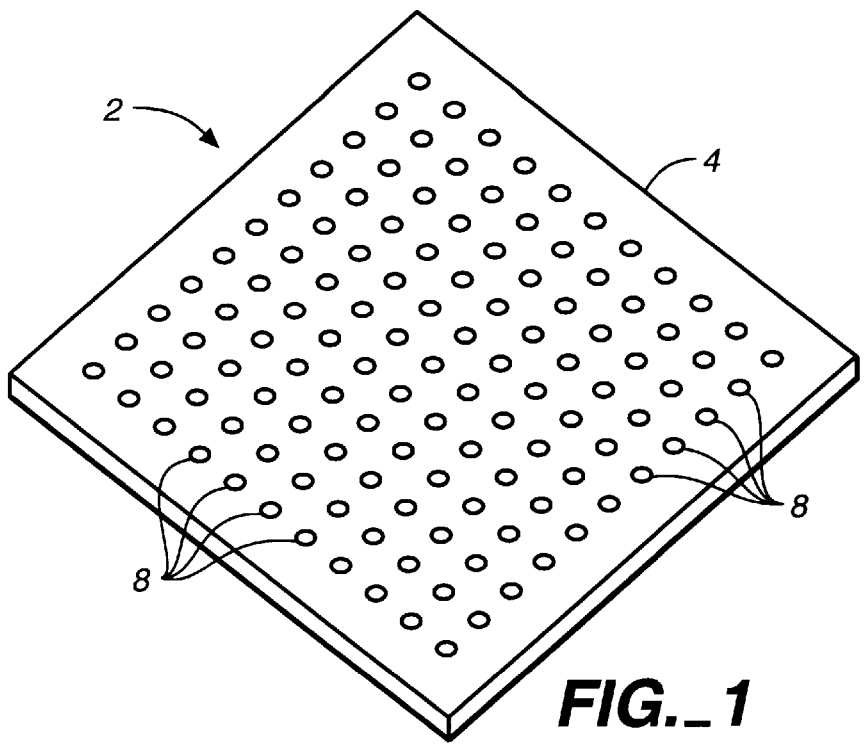
FIG._1
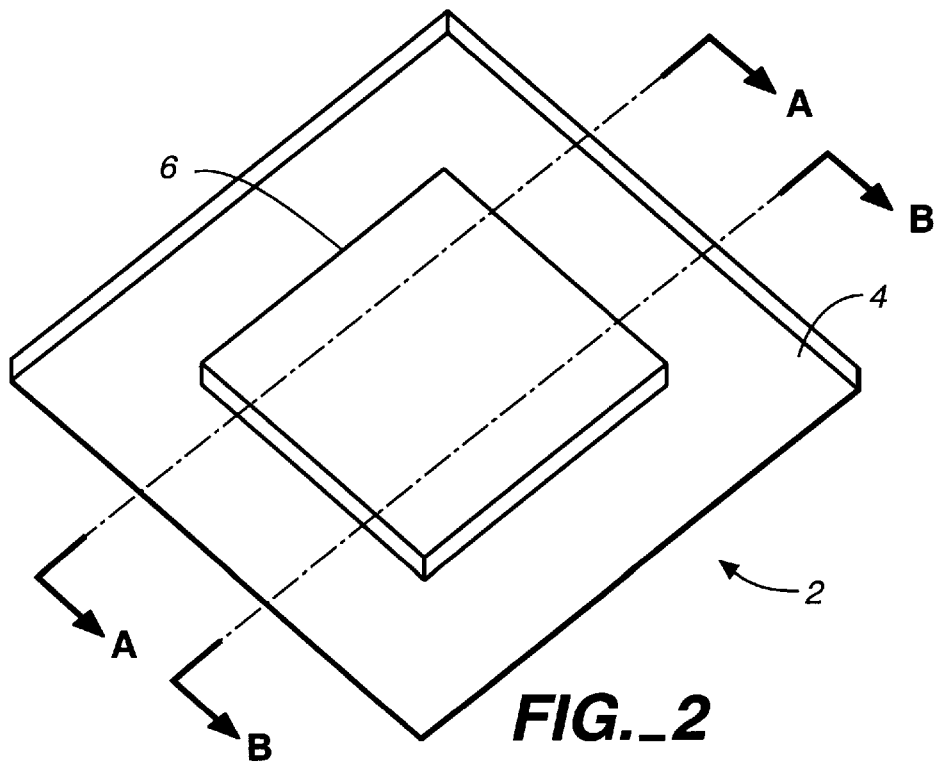
FIG._2

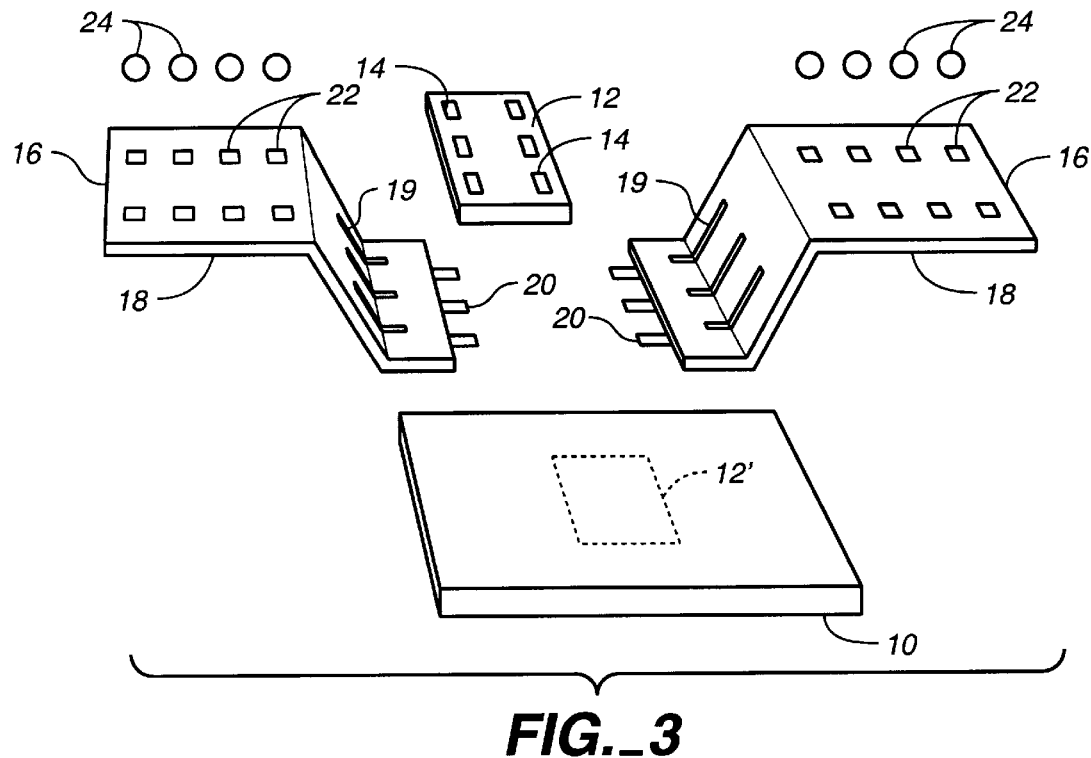
FIG._3
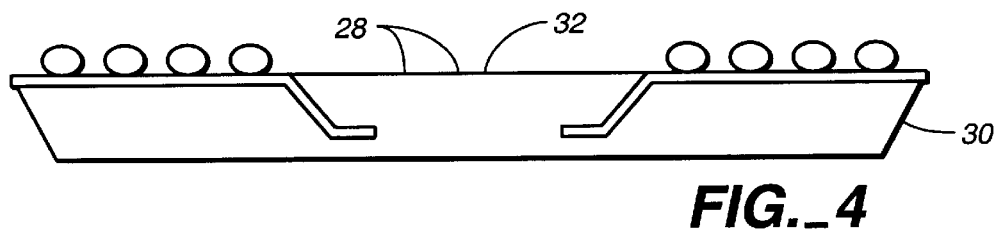
FIG._4
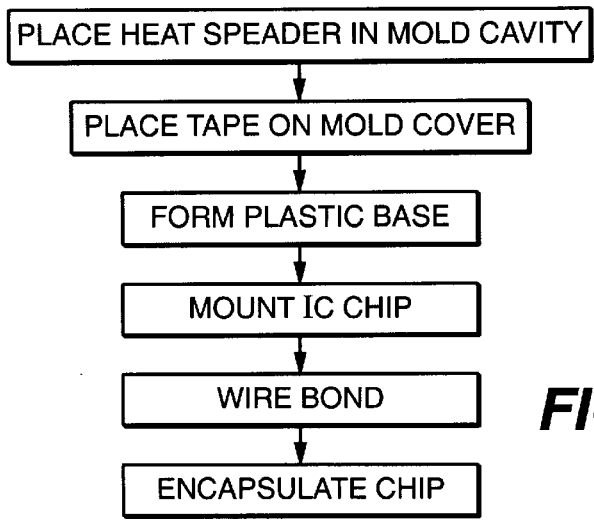
FIG._5

HIGH POWER DISSIPATING TAPE BALL GRID ARRAY PACKAGE

BACKGROUND OF THE INVENTION

This invention relates generally to semiconductor integrated circuit packages, and more particularly the invention relates to a premolded tape ball grid array package having high power dissipating capabilities.

The semiconductor integrated circuit chip must be mounted and sealed on a supporting substrate with the substrate providing interconnect electrical leads for supplying electrical signals and voltages to and from the integrated circuit. The ball grid array package is presently used for housing and interconnecting large scale integrated circuits. See copending application Ser. No. 08/625,641 filed Mar. 29, 1996, incorporated herein by reference. Typically, the substrate is a rigid ceramic, for example, which includes metal lead patterns to which the chip contacts are wire bonded. Laminated substrates having multiple metal layers have been used as well as rigid tape substrates. Tape automated bonding (TAB) is typically used with the rigid tape substrates. Solder balls are used to interconnect the substrate leads to electrical contacts on a motherboard on which the substrate is mounted as a component in a larger circuit or system.

The two generic constructions for ball grid array packages are die up and die down configurations. In the die up configuration, the chip is attached to the top surface of the substrate and the balls are attached to the bottom face. In the die down configuration, the chip and balls are on the same surface of the substrate. In the die up configuration, the substrate generally has two metal layers, one on each surface of the substrate. Vias are formed in the substrate to interconnect the two metal layers.

The ceramic and laminate substrates are costly to manufacture. In most substrates, there are two or more layers of metal in the substrate which are connected by vias drilled in the substrates. This results in costly substrates. The die up configuration has greater thermal resistance, thus resulting in lower heat dissipation. This limits the power of the chip that can go into the package. With a standard plain or laminate, the bond pads and balls are on the same level, which limits the height of the bonds and thus the density of the package. Further, laminate and ceramic substrates are limited in the routing density which limits the separation of the balls on the package.

The present invention is directed to a ball grid array package which is economical to manufacture and provides high power heat dissipation.

SUMMARY OF THE INVENTION

Briefly, in accordance with the present invention, a thin, high power dissipating tape ball grid array package is provided in which a flex polyimide tape and a heatspreader are premolded to form a substrate. The use of flex tape for the interconnect for the substrate has the advantages of fine line routing and low cost. Use of wire bonding for the interconnection between the chip and the tape allows for design flexibility and economy of manufacture. Molding the flex tape and heatspreader together is a reliable and economic method of forming a package that has high density interconnect and high thermal performance.

The invention and objects and features thereof will be more readily apparent from the following detailed description and appended claims when taken with the drawing.

BRIEF DESCRIPTION OF THE DRAWINGS

FIG. 1 is a top perspective view of a ball grid array integrated circuit package.

FIG. 2 is a bottom perspective view of the package of FIG. 1.

FIG. 3 is an exploded perspective view of elements of a premolded tape ball grid array package in accordance with the invention.

FIG. 4 is a section view of the assembled tape ball grid array package of FIG. 3.

FIG. 5 is a flow diagram of the process in fabricating the tape ball grid array package of FIGS. 3, 4.

DETAILED DESCRIPTION OF THE ILLUSTRATIVE EMBODIMENT

FIGS. 1, 2 are a top perspective view and a bottom perspective view of a ball grid array integrated circuit package 2 including a substrate 4 and an encapsulated integrated circuit 6 mounted thereon. Bonding pads on the integrated circuit 6 are interconnected by wire bonding with solder ball contacts 8 on the top surface of substrate 4. An interconnect lead pattern (not shown) on substrate 4 is connected to solder balls, also.

FIG. 3 is an exploded perspective view of elements of the tape ball grid array package of FIGS. 1, 2 between lines A—A and B—B except for plastic molding and encapsulation material. The package includes a heatspreader 10 of a stamped or milled metal sheet of copper or aluminum or other suitable heat conductive metal. A semiconductor integrated circuit chip 12 is affixed by suitable adhesive to heatspreader 10 in the dotted surface area designated 12'. Chip 12 includes a plurality of bonding pads 14 for interconnecting the chip through wire bonding with flex tape 16 having bottom metallic interconnect patterns 18 insulatively supported on heatspreader 10. Exposed ends 20 of the conductive metal layers 18 are positioned adjacent to chip 12 for wire bonding to the bonding pads 14 on chip 12. Flex tape 16 includes a plurality of apertures 22 which expose underlying metal lead patterns 18 for interconnection with solder balls 24 when mounting the ball grid array package to a motherboard.

FIG. 4 is a section view illustrating the assembled premolded tape ball grid array package of FIG. 3 and includes injection molded plastic base 30 and epoxy 32 encapsulating chip 12 and wire bonding shown at 28. Solder balls 34 connect the package to a motherboard.

FIG. 5 is a flow diagram illustrating steps in fabricating the premolded tape ball grid array package of FIGS. 3, 4. Initially, heatspreader 10 is placed in the bottom of a mold cavity, and the tape 16 is placed on a cover for the mold with exposed ends 20 separated by insulation when placed on heatspreader 10. For example, a polymide insulation layer can be placed on the heatspreader surface receiving the exposed ends, or the surface can be anodized aluminum which is non conductive. Plastic base 30 is then formed by injection molding which forms a unitary structure with the heatspreader and flex tape. Thereafter, the integrated circuit chip is mounted on heatspreader 10 by suitable adhesive and the contacts on the chip are interconnected with the lead pattern of the flex tape by means of wire bonding 28. The chip and wire bonding are then encapsulated on the heatspreader by means of the epoxy or potting material 32.

The premolded tape ball grid array package in accordance with the invention allows greater density of interconnect from the chip to the balls and, thus, higher density packages.

The chip attachment directly to the heatspreader allows for higher heat dissipation and thus permits a higher power package. Further, the flex tape for the substrate is cheaper to manufacture than laminates and ceramic. The wire bonding for the interconnect of the chip and substrate is lower in cost and has higher flexibility than TAB interconnects. Thus, the resulting package is economical to manufacture and is very thin and light.

While the invention has been described with reference to specific embodiments, the description is illustrative of the invention and is not limiting of the invention. For example, laminate and ceramic substrates could be employed for the heatspreader, and TAB assembly can be employed. Thus, various modifications and applications may occur to those skilled in the art without departing from the true spirit and scope of the invention as defined by the appended claims.

What is claimed is:

1. An integrated circuit package comprising:
   a molded plastic base structure including a heat conductive substrate and flex tape extending from opposing sides of the substrate with molded plastic between the flex tape and the substrate, the flex tape having a conductive metal lead pattern on a side of the tape facing the substrate and a plurality of apertures exposing the conductive lead pattern from an opposing side of the tape for solder ball bonding,
   a semiconductor integrated circuit chip with an active side and a non-active side, the non-active side mounted to a central portion of the substrate, the chip having bond pads on the active side for interconnecting the integrated circuit,
   wire bonding interconnecting the bond pads on the chip to the metal lead pattern; and
   material encapsulating the chip and wire bonding to the substrate.

2. The integrated circuit package as defined by claim 1 and further including a plurality of solder balls contacting the conductive lead pattern through the plurality of apertures.

3. The integrated circuit package as defined by claim 1 wherein said flex tape comprises polyimide tape.

4. The integrated circuit package as defined by claim 1 wherein the heat conductive substrate comprises a metal.

5. The integrated circuit package as defined by claim 1 wherein the heat conductive substrate is selected from a ceramic and a laminate structure.

6. An integrated circuit package comprising:
   a base structure comprising molded plastic, a substrate and flex tape extending from opposing sides of the substrate wherein molded plastic attaches at least a portion of the flex tape to the base structure, the flex tape having a conductive metal lead pattern on a side of the tape and a plurality of apertures exposing the conductive lead pattern from an opposing side of the tape for solder ball bonding,
   a semiconductor integrated circuit chip with an active side and a non-active side, the non-active side mounted to a central portion of the substrate, the chip having bond pads on the active side for interconnecting the integrated circuit,
   wire bonding interconnecting the bond pads on the chip to the metal lead pattern; and
   material encapsulating the chip and wire bonding to the substrate.

7. The integrated circuit package as defined by claim 6 wherein the molded plastic base structure further comprises a heat conductive substrate.

8. The integrated circuit package as defined by claim 6 wherein at least a portion of the molded plastic is disposed between the flex tape and the substrate.

9. The integrated circuit package as defined by claim 6 further comprising a plurality of solder balls disposed along portions of a side of the integrated circuit package and wherein the substrate is disposed along portions of an opposing side of the integrated circuit package.

10. An integrated circuit package comprising:
    a base with a top surface and a bottom surface, the base having a cavity with side walls and a bottom, the base comprising:
       a substrate having a top surface and a bottom surface, the bottom surface of the substrate comprising at least a portion of the bottom surface of the base, the top surface of the substrate comprising at least a portion of the bottom of the cavity; and
       molded plastic adjacent the substrate, the molded plastic comprising at least a portion of the side walls of the cavity such that the substrate and the molded plastic define the cavity, the molded plastic comprising at least a portion of the top and bottom surfaces of the base;
    a semiconductor integrated circuit chip with an active side and a non-active side, the non-active side mounted to the top surface of the substrate such that the chip is within the cavity, the chip having bond pads on the active side for interconnecting the integrated circuit;
    flex tape having a conductive metal lead pattern on a first side and a plurality of apertures exposing the conductive lead pattern from an opposing side of the tape for solder ball bonding, at least a portion of the opposing side of the flex tape adjacent to the top surface of the base, and
    wire bonding interconnecting the bond pads on the chip to the metal lead pattern.

11. The integrated circuit package as defined by claim 10 wherein the flex tape extends from at least one side of the substrate along at least one of the side walls of the cavity.

12. The integrated circuit package as defined by claim 10 wherein all of the side walls of the cavity comprise the molded plastic.

13. The integrated circuit package as defined by claim 10 wherein the top surface of the substrate comprises the entire bottom of the cavity.

14. The integrated circuit package as defined by claim 10 wherein the flex tape touches the top surface of the base.

15. The integrated circuit package as defined by claim 10 further comprising material at least partially filling the cavity, the material encapsulating the chip and wire bonding to the substrate.

* * * * *